(12) United States Patent
Woo

(10) Patent No.: US 8,982,991 B2
(45) Date of Patent: Mar. 17, 2015

(54) DIGITAL PRE-DISTORTION METHOD AND APPARATUS THEREOF FOR CHANGING MEMORY DEGREE DEPENDING ON INPUT LEVEL

(71) Applicant: Samsung Electronics Co. Ltd., Suwon-si, Gyeonggi-do (KR)

(72) Inventor: Young-Yoon Woo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 13/655,914

(22) Filed: Oct. 19, 2012

(65) Prior Publication Data

US 2013/0100991 A1   Apr. 25, 2013

(30) Foreign Application Priority Data

Oct. 20, 2011   (KR) ........................ 10-2011-0107542

(51) Int. Cl.
  *H04K 1/02*   (2006.01)
  *H03F 1/32*   (2006.01)
  *H03F 3/24*   (2006.01)

(52) U.S. Cl.
  CPC ............... *H03F 1/3247* (2013.01); *H03F 3/24* (2013.01); *H03F 2201/3224* (2013.01)

USPC ........... 375/296; 375/224; 375/295; 300/149; 455/114.3

(58) Field of Classification Search
USPC .................... 375/219, 316; 330/149
See application file for complete search history.

(56) References Cited

U.S. PATENT DOCUMENTS

| | | | |
|---|---|---|---|
| 7,746,167 B1 * | 6/2010 | Summerfield | 330/149 |
| 8,351,877 B2 * | 1/2013 | Kim et al. | 455/114.3 |
| 8,649,745 B2 * | 2/2014 | Bai et al. | 455/114.3 |
| 2007/0296495 A1 * | 12/2007 | Shako et al. | 330/149 |
| 2008/0197925 A1 * | 8/2008 | Furuta et al. | 330/149 |
| 2010/0214018 A1 * | 8/2010 | Saed | 330/149 |
| 2010/0277236 A1 | 11/2010 | Horiguchi et al. | |
| 2011/0096865 A1 | 4/2011 | Hori et al. | |
| 2011/0170630 A1 | 7/2011 | Silverman et al. | |
| 2012/0219048 A1 * | 8/2012 | Camuffo et al. | 375/224 |

* cited by examiner

*Primary Examiner* — Eva Puente
(74) *Attorney, Agent, or Firm* — Jefferson IP Law, LLP

(57) ABSTRACT

An apparatus and a method for operating a memory compensation Digital Pre-Distortion (DPD) are provided. In the method for operating a memory compensation DPD system, an input signal is received. An input average power of the input signal is determined. When the input average power of the input signal belongs to a non-linear section of the input average power, DPD is performed on a previous signal corresponding to a memory degree set depending on at least one non-linear section of the input average power.

12 Claims, 4 Drawing Sheets

DIGITAL PRE-DISTORTION METHOD AND APPARATUS THEREOF FOR CHANGING MEMORY DEGREE DEPENDING ON INPUT LEVEL

PRIORITY

This application claims the benefit under 35 U.S.C. §119 (a) of a Korean patent application filed on Oct. 20, 2011 in the Korean Intellectual Property Office and assigned Serial No. 10-2011-0107542, the entire disclosure of which is hereby incorporated by reference.

BACKGROUND OF THE INVENTION

1. Field of the Invention

The present invention relates to a method and an apparatus for improving performance of a Digital Pre-Distorter (DPD). More particularly, the present invention relates to a method for improving performance of a DPD and an electronic device employing the method.

2. Description of the Related Art

In case of a general transmission system, since a fixed complicated memory compensation Digital Pre-Distorter (DPD) is used regardless of an input level, it is difficult to perform a fast response to a change such as a calculation speed of the pre-distorter, a convergence speed, temperature, an environment, etc. Accordingly, an adverse influence is caused to stability and securing performance of a system.

SUMMARY OF THE INVENTION

Aspects of the present invention are to address at least the above-mentioned problems and/or disadvantages and to provide at least the advantages described below. Accordingly, an aspect of the present invention is to provide a Digital Pre-Distortion (DPD) method and an apparatus thereof for changing a memory degree depending on an input level.

Another aspect of the present invention is to provide a method and an apparatus for improving performance of a power transmission system by changing Digital Pre-Distorter (DPD) complexity depending on an input level of a transmission system.

Further another aspect of the present invention is to provide a method and an apparatus for improving a calculation speed of a DPD and a convergence speed of the DPD by changing a memory degree of the DPD depending on a magnitude of an input average level to change complexity of the DPD, and simplifying a structure of the DPD with respect to a low input average power in a DPD transmission system.

Still yet another aspect of the present invention is to provide a method and an apparatus for enabling fast adaptation with respect to a change such as an input, a temperature, environment, etc. of a power amplifier.

In accordance with an aspect of the present invention, a method for operating a memory compensation Digital Pre-Distortion (DPD) system is provided. The method includes receiving an input signal, determining an input average power of the input signal, and when the input average power of the input signal belongs to a non-linear section of the input average power, performing DPD on a previous signal corresponding to a memory degree set depending on at least one non-linear section of the input average power.

In accordance with another aspect of the present invention, a memory compensation Digital Pre-Distortion (DPD) system is provided. The system includes a memory compensation Digital Pre-Distorter (DPD) for receiving an input signal, determining an input average power of the input signal, and when the input average power of the input signal belongs to a non-linear section of the input average power, performing DPD on a previous signal corresponding to a memory degree set depending on at least one non-linear section of the input average power, wherein the memory compensation DPD includes an Average Power Meter (APM) for determining the input average power of the input signal, a switch controller for providing a switch signal for performing DPD on the previous signal corresponding to the memory degree set depending on the at least one non-linear section of the input average power, and at least one DPD for performing DPD on the previous signal depending on the switch signal.

In accordance with another aspect of the present invention a method for operating a memory compensation Digital Pre-Distortion (DPD) system is provided. The method includes receiving an input signal, measuring an input average power of the input signal, determining a non-linear section to which the input average power of the input signal belongs, performing DPD on a current input signal and performing DPD on a previous input signal according to the determined non-linear section to which the input average power of the input signal belongs, and adding the DPD current input signal and the DPD previous input signal and outputting an output signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention relates to a method and an apparatus for improving performance of a DPD by changing a memory degree depending on an input average power of the DPD.

Exemplary embodiments of the present invention provide a DPD method and an apparatus thereof for changing a memory degree depending on an input level.

Figure 1:
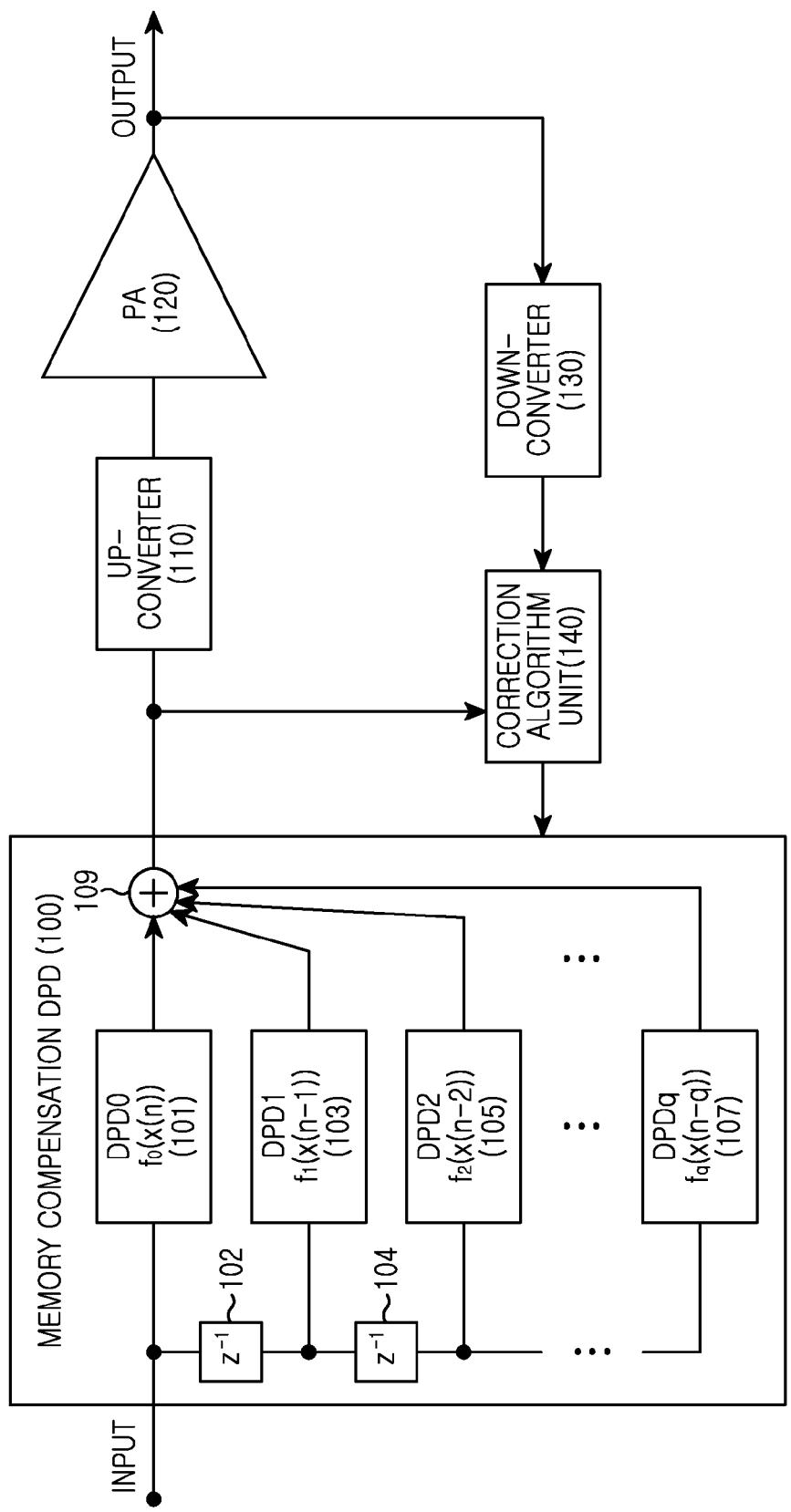
FIG. 1 is a basic block diagram illustrating a power transmission system according to an exemplary embodiment of the present invention.

FIG. 1 is a basic block diagram illustrating a power transmission system according to an exemplary embodiment of the present invention.

Referring to FIG. 1, a memory compensation DPD 100 compares an input signal with an output signal in order to linearize an output of a Power Amplifier (PA) 120 and minimizes a distorted component of the output signal to allow an input modulated signal to be linearly amplified and output as illustrated.

In the case where a wide bandwidth signal where a data rate is high such as a WCDMA, WiMax, LTE, etc. is used as an input modulated signal of a power transmission system, a distorted component of the PA 120 includes a distorted component by a memory effect as well as a non-linear component. The distorted component by the memory effect is raised in proportion to a band of a signal.

To compensate for both the non-linear distorted component and the distorted component by the memory effect, the memory compensation DPD 100 requires summation (109) of a DPD0 101 for a current input signal and a DPD1 103, a DPD2 105, ..., a DPDq 107 for previous signals 102, 104 .... For linearization of a rated output power from the PA over a wide bandwidth, memory compensation DPD of a complicated structure is required.

The memory compensation DPD 100 may perform DPD using a DPD correction coefficient provided by a correction algorithm unit 140. The algorithm for use may be a generally used algorithm.

The rated output power denotes an output power when the number of terminal users is maximum, that is, traffic is maximum. In the case where the number of terminal users reduces and so traffic reduces, the output power lowers and a distortion characteristic of a PA gets better, so that a complicated DPD structure required by the rated output power may be simplified.

For extraction of a distortion component of the PA 120 and DPD correction performance of the correction algorithm unit 140 for an operation of the memory compensation DPD 100, an input signal representing an entire signal and an output signal thereof are required.

The correction algorithm unit 140 receives output signals of the memory compensation DPD 100 and a down-converter 130 as an input and provides a DPD correction coefficient for memory compensation DPD to the memory compensation DPD 100. A process for allowing the correction algorithm unit 140 to determine the DPD correction coefficient may be a generally used algorithm.

An up-converter 110 up-converts an output signal of the memory compensation DPD 100 to provide the same to the PA 120, and the down-converter 130 down-converts an output signal of the PA 120 to provide the same to the correction algorithm unit 140.

Figure 2:
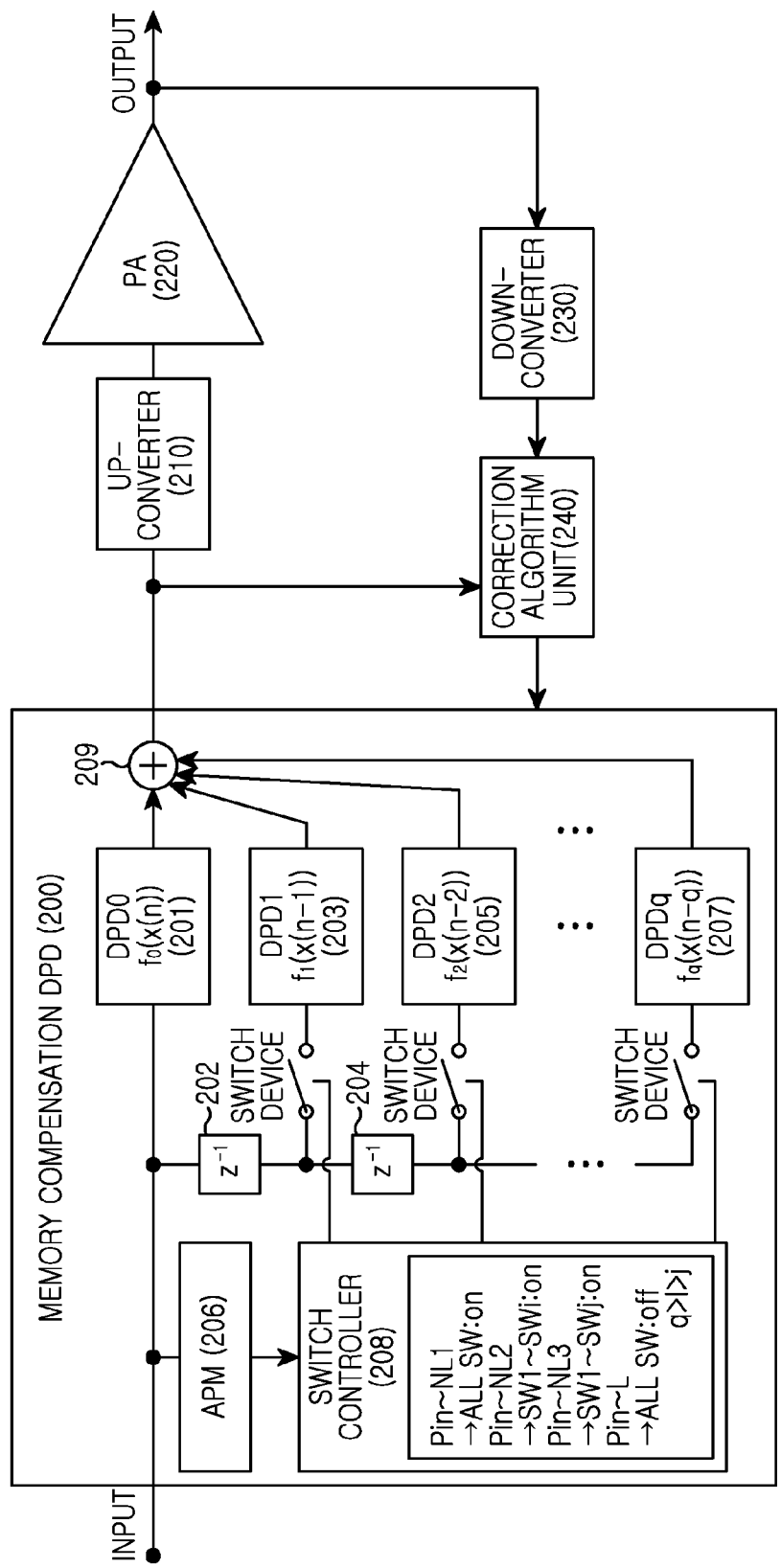
FIG. 2 is a block diagram illustrating a Digital Pre-Distorter (DPD) system according to an exemplary embodiment of the present invention.

FIG. 2 is a block diagram illustrating a Digital Pre-Distorter (DPD) system according to an exemplary embodiment of the present invention.

Referring to FIG. 2, operations of an up-converter 210, a down-converter 230, a PA 220, and a correction algorithm unit 240 are the same as those of FIG. 1. In addition, according to an exemplary embodiment, a memory compensation DPD 200 and the correction algorithm unit 240 may be referred to as a controller. That is, these elements may operate as software in a CPU.

The memory compensation DPD 200 includes an Average Power Meter (APM) 206, a switch controller 208, a plurality of switch devices 202, 204, ... and a plurality of DPDs 201, 203, 205, ..., 207.

To compensate for both a non-linear distorted component and a distorted component by a memory effect, the memory compensation DPD 200 requires summation (209) of a DPD0 201 for a current input signal and a DPD1 203, a DPD2 205, ..., a DPDq 207 for previous signals 202, 204, ....

The APM 206 measures an input average power to provide the measured input average power to the switch controller 208.

The switch controller 208 determines a memory degree for DPD depending on the average power.

In the case where a value of an input average power Pin provided by the APM 206 belongs to set sections (non-linear section 1, non-linear section 2, non-linear section 3, linear section) of the input average power, the switch controller 208 controls a relevant switch device with respect to each section of the input average power to control operations of the DPDs 201, 203, 205, ..., 207.

The sections set by the switch controller 208 for determining an input average power value are described below.

Figure 4:
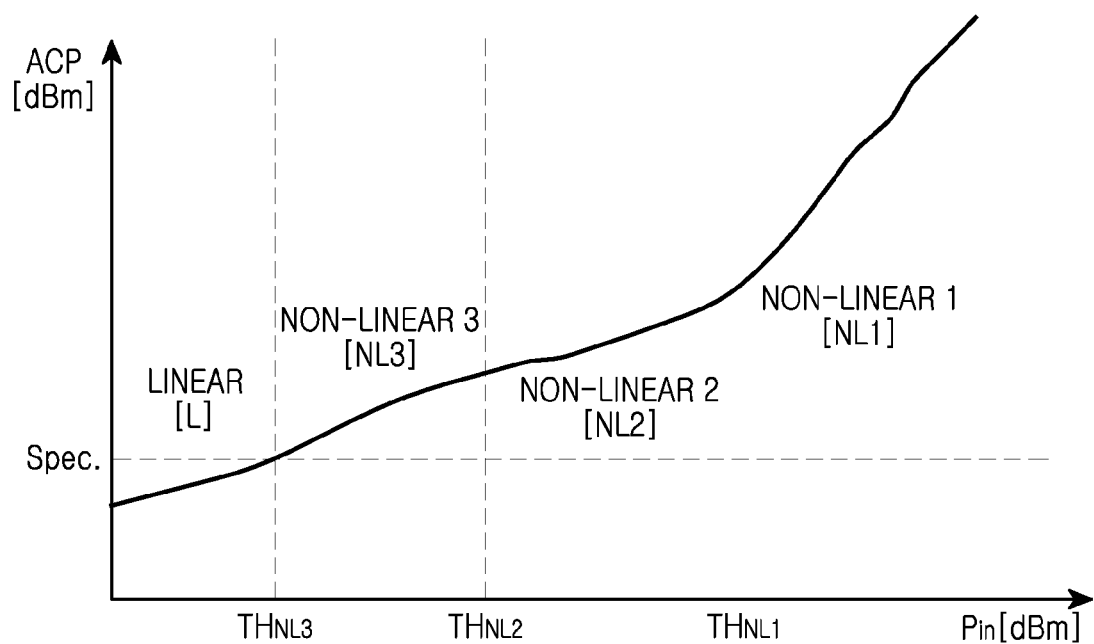
FIG. 4 is a graph illustrating an output Adjacent Channel Power (ACP) characteristic of a power amplifier depending on an input average level Pin of the power amplifier, linearity specification of a transmission system, and a threshold for each section according to an exemplary embodiment of the present invention.

Referring to FIG. 4, in the case where the input average power value belongs to the first non-linear section $NL_1$-$P_{in}$, the switch controller 208 turns on all switch devices. The memory compensation DPD 200 operates all inner DPDs 201, 203, 205, ..., 207, and adds (209) an output signal of the DPD0 201 for a current input signal and output signals of the DPD1 203, DPD2 205, ..., DPD7 207 for previous signals 202, 204, ... ($f_0(x(n))+f_1(x(n-1))+ ... +f_q(x(n-q))$).

In the case where the input average power value belongs to the second non-linear section $NL_2$-$NL_1$, the switch controller 208 turns on a portion of the switch devices depending on a set value. The memory compensation DPD 200 operates a portion of the inner DPDs, and adds (209) an output signal of the DPD0 201 for a current input signal and output signals of the DPD1, DPD2, ..., DPDi for previous signals.

In the case where the input average power value belongs to the third non-linear section $NL_2$-$NL_3$, the switch controller 208 turns on a portion of the switch devices depending on a set value. The memory compensation DPD 200 operates a portion of the inner DPDs, and adds (209) an output signal of the DPD0 201 for a current input signal and output signals of the DPD1, DPD2, ..., DPDj for previous signals.

In the case where the input average power value belongs to the linear section L, the switch controller 208 turns off all the switch devices depending on a set value. The memory compensation DPD 200 outputs only an output signal of the DPD 0 201 for a current input signal.

When traffic increases, an input average power value has a non-linear characteristic. As the traffic increases, the number of DPDs operating for DPD with respect to previous signals increases. If the input average power has a linear characteristic, necessity of DPD for a previous signal disappears.

The memory compensation DPD of FIG. 1 always uses a fixed complicated digital entire distortion structure regardless of input power and complexity change of the PA, but the memory compensation DPD of FIG. 2 has a characteristic of considering the input power and the complexity change of the PA.

Figure 3:
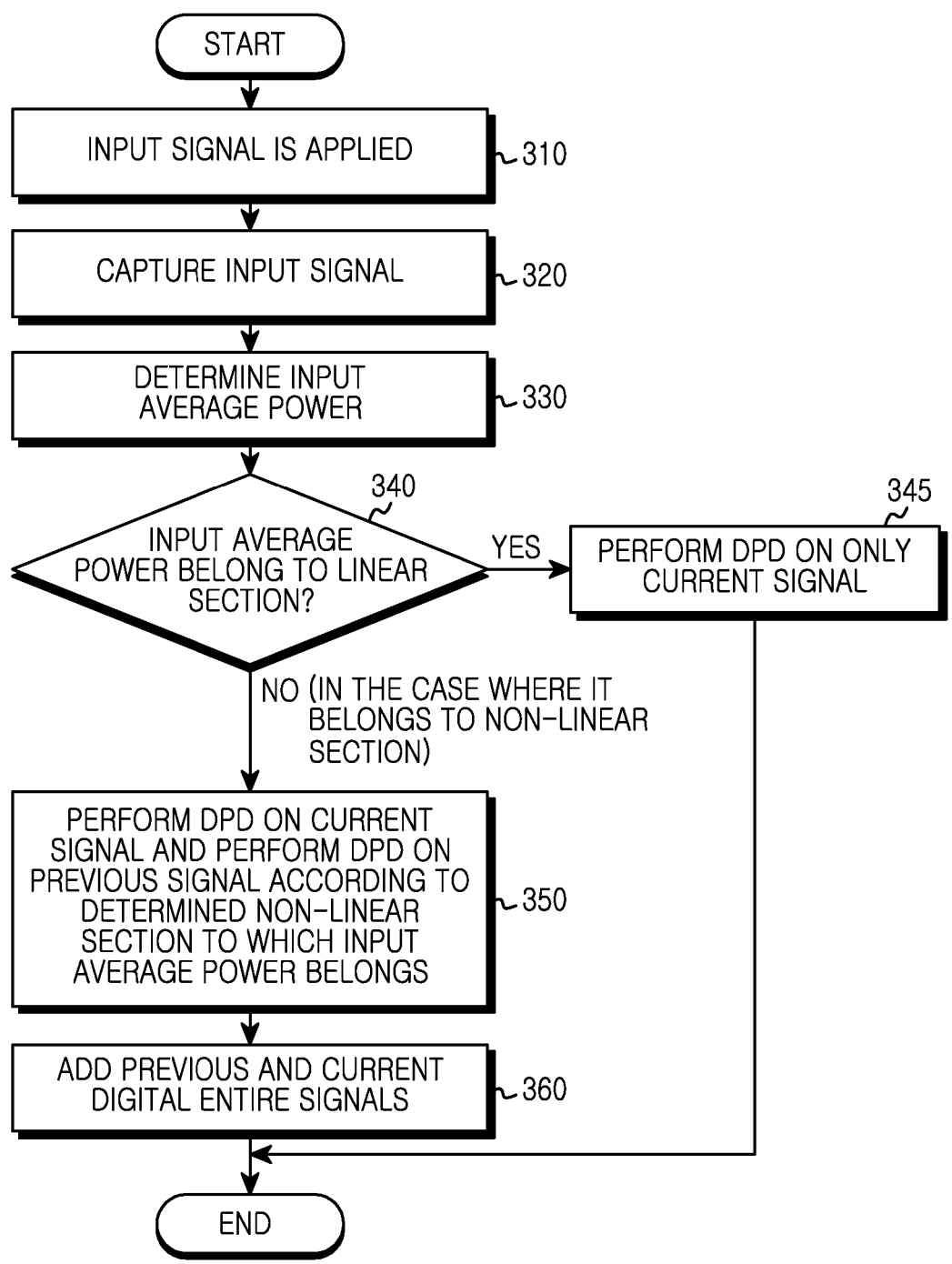
FIG. 3 is a flowchart illustrating a process for operating a DPD system according to an exemplary embodiment of the present invention.

FIG. 3 is a flowchart illustrating a process for operating a DPD system according to an exemplary embodiment of the present invention.

Referring to FIG. 3, after an input signal is applied in step 310, a memory compensation DPD of a digital entire distortion system according to an exemplary embodiment captures the input signal in step 320, and determines an input average power of the input signal in step 330.

After determining the input average power of the input signal, in the case where the input average power belongs to a linear section in step 340, the memory compensation DPD performs DPD on only a current signal (input signal) in step 345.

In the case where the input average power belongs to a non-linear section, the memory compensation DPD performs DPD on a current signal and performs DPD on a previous signal with consideration of a memory degree depending on a predetermined non-linear section to which the input average power belongs in step 350.

After performing DPD on a current signal and performing DPD on a previous signal with consideration of a memory degree depending on a predetermined non-linear section to which the input average power belongs, the memory compensation DPD adds previous and current DPD signals in step 360.

FIG. 4 is a graph illustrating an output Adjacent Channel Power (ACP) characteristic of a power amplifier depending on an input average level Pin of the power amplifier, linearity specification (Spec.) of a transmission system, and a threshold (TH) for each section according to an exemplary embodiment of the present invention.

Referring to FIG. 4, the input average power Pin is divided into NL1, NL2, and NL3. Each section is a section divided depending on an ACP value by a non-linear characteristic. As the input average power value passes through NL1, NL2, and NL3, a memory degree for DPD is simplified, so that a DPD structure whose complexity gradually lowers is achieved. Accordingly, as the input average power value passes through NL1, NL2, and NL3, the number of DPDs reduces.

Since a section L is a section lower than the linearity specification of the transmission system and having no problem even when a memory effect of the PA is not compensated for, all switch devices may be safely turned off. The number and position of sections for NL and L sections may change depending on a non-linear distortion characteristic of the PA, a memory distortion characteristic, specification, etc.

According to an exemplary embodiment, a DPD transmission system changes complexity of a DPD to simplify a DPD structure with respect to a low input average power by changing a DPD memory degree depending on a magnitude of an input average level, so that a calculation speed of the DPD and a convergence speed of the DPD improve.

These advantages enable fast adaptation in response to a change such as an input of a PA, temperature, an environment, etc., and performance of the DPD transmission system may improve through this.

It will be appreciated that embodiments of the present invention according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present invention.

Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present invention.

Accordingly, embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

While the invention has been shown and described with reference to certain exemplary embodiments thereof, it will be understood by those skilled in the art that various changes in form and details may be made therein without departing from the spirit and scope of the invention as defined by the appended claims and their equivalents.

Therefore, the scope of the present invention should not be limited to the above-described embodiments but should be determined by not only the appended claims but also the equivalents thereof.

What is claimed is:

1. A method for operating a memory compensation Digital Pre-Distortion (DPD) system, the method comprising:
   receiving an input signal;
   determining an input average power of the input signal; and
   when the input average power of the input signal belongs to a non-linear section of the input average power, performing DPD on a previous signal corresponding to a memory degree set depending on at least one non-linear section of the input average power, and
   when the input average power of the input signal belongs to a linear section of the input average power, performing DPD on a current input signal to output an output signal.

2. The method of claim 1, further comprising adding a signal obtained by performing DPD on the previous signal and a signal obtained by performing DPD on the current input signal to output the output signal.

3. The method of claim 2, further comprising:
   up-converting the output signal; and
   amplifying the up-converted signal.

4. The method of claim 3, further comprising:
down-converting the amplified signal;
determining a DPD correction coefficient for DPD from the down-converted amplified signal; and
outputting the DPD correction coefficient for the DPD.

5. A memory compensation Digital Pre-Distortion (DPD) system, the system comprising:
a memory compensation Digital Pre-Distorter (DPD) for receiving an input signal, determining an input average power of the input signal, and when the input average power of the input signal belongs to a non-linear section of the input average power, performing DPD on a previous signal corresponding to a memory degree set depending on at least one non-linear section of the input average power,
wherein the memory compensation DPD comprises:
an Average Power Meter (APM) for determining the input average power of the input signal,
a switch controller for providing a switch signal for performing DPD on the previous signal corresponding to the memory degree set depending on the at least one non-linear section of the input average power, and
at least one DPD for performing DPD on the previous signal depending on the switch signal.

6. The system of claim 5, further comprising an adder for adding a signal obtained by performing DPD on the previous signal and a signal obtained by performing DPD on the current input signal to output an output signal.

7. The system of claim 6, further comprising:
an up-converter for up-converting the output signal; and
an amplifier for amplifying the up-converted signal.

8. The system of claim 7, further comprising:
a down-converter for down-converting the amplified signal; and
a correction algorithm unit for determining a DPD correction coefficient for DPD from the down-converted amplified signal, and outputting the DPD correction coefficient for the DPD.

9. The system of claim 5, further comprising:
a DPD for, when the input average power belongs to a linear section of the input average power, performing DPD on a current input signal to output an output signal.

10. The system of claim 9, further comprising:
an up-converter for up-converting the output signal; and
an amplifier for amplifying the up-converted signal.

11. The system of claim 10, further comprising:
a down-converter for down-converting the amplified signal; and
a correction algorithm unit for determining a DPD correction coefficient for DPD from the down-converted amplified signal, and outputting the DPD correction coefficient for the DPD.

12. A method for operating a memory compensation Digital Pre-Distortion (DPD) system, the method comprising:
receiving an input signal;
measuring an input average power of the input signal;
determining a section to which the input average power of the input signal belongs;
performing DPD on a current input signal and performing DPD on a previous input signal when determined that the section to which the input average power of the input signal belongs to a non-linear section; and
adding the DPD current input signal and the DPD previous input signal and outputting an output signal; and
performing DPD on only the current input signal when determined that the section to which the input average power of the input signal belongs to a linear section.

* * * * *